(12) United States Patent
Velichko

(10) Patent No.: US 9,942,503 B2
(45) Date of Patent: Apr. 10, 2018

(54) IMAGE SENSORS HAVING HIGH-EFFICIENCY CHARGE STORAGE CAPABILITIES

(71) Applicant: SEMICONDUCTOR COMPONENTS INDUSTRIES, LLC, Phoenix, AZ (US)

(72) Inventor: Sergey Velichko, Boise, ID (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 72 days.

(21) Appl. No.: 15/174,649

(22) Filed: Jun. 6, 2016

(65) Prior Publication Data

US 2017/0244921 A1 Aug. 24, 2017

Related U.S. Application Data

(60) Provisional application No. 62/298,638, filed on Feb. 23, 2016.

(51) Int. Cl.
*H04N 5/378* (2011.01)
*H01L 27/146* (2006.01)
(Continued)

(52) U.S. Cl.
CPC ......... *H04N 5/378* (2013.01); *H01L 27/1461* (2013.01); *H01L 27/1463* (2013.01);
(Continued)

(58) Field of Classification Search
CPC ...... H04N 5/378; H04N 5/3597; H04N 5/363; H04N 5/37452; H04N 5/37455; H01L 27/14609; H01L 27/1461; H01L 27/14612; H01L 27/14621; H01L 27/14623; H01L 27/14627; H01L 27/14629; H01L 27/1463; H01L 27/14636; H01L 28/40
See application file for complete search history.

(56) References Cited

U.S. PATENT DOCUMENTS

| RE34,926 E | * | 5/1995 | Hieda | ................... H04N 9/735 |
| | | | | 348/223.1 |
| 6,246,436 B1 | * | 6/2001 | Lin | ......................... G01J 1/46 |
| | | | | 257/E27.132 |

(Continued)

*Primary Examiner* — Nicholas G Giles
(74) *Attorney, Agent, or Firm* — Treyz Law Group, P.C.; Michael H. Lyons; David K. Cole

(57) ABSTRACT

An image pixel may include a photodiode, storage node, floating diffusion, and capacitor. A first transistor may be coupled between the photodiode and the storage node. A second transistor may be coupled between the storage node and the floating diffusion. A third transistor may be coupled between the capacitor and the floating diffusion. A potential barrier may be formed between the storage node and the capacitor. The potential barrier may exhibit a potential that is between the potential of the photodiode and the potential of the charge storage node. The potential barrier may transfer an overflow portion of image charge from the storage node to the capacitor. The third transistor may transfer the overflow charge from the capacitor to the floating diffusion. The capacitor may shield the storage node from image light or may reflect at least some of the image light towards the photodiode.

19 Claims, 10 Drawing Sheets

(51) Int. Cl.
  *H01L 27/00*    (2006.01)
  *H04N 5/359*    (2011.01)
  *H04N 5/363*    (2011.01)
  *H04N 5/3745*   (2011.01)
  *H01L 49/02*    (2006.01)

(52) U.S. Cl.
  CPC .. *H01L 27/14609* (2013.01); *H01L 27/14612* (2013.01); *H01L 27/14621* (2013.01); *H01L 27/14623* (2013.01); *H01L 27/14627* (2013.01); *H01L 27/14629* (2013.01); *H01L 27/14636* (2013.01); *H01L 28/40* (2013.01); *H04N 5/3597* (2013.01); *H04N 5/363* (2013.01); *H04N 5/37452* (2013.01); *H04N 5/37455* (2013.01)

(56) References Cited

U.S. PATENT DOCUMENTS

| | | | |
|---|---|---|---|
| 7,491,990 B2 | 2/2009 | Park | |
| 7,697,051 B2* | 4/2010 | Krymski | H01L 27/14609 250/208.1 |
| 7,833,819 B2 | 11/2010 | Velichko et al. | |
| 7,990,449 B2* | 8/2011 | Fossum | H01L 27/14609 348/294 |
| 8,692,198 B2* | 4/2014 | Jiang | H01L 27/1461 250/200 |
| 8,847,136 B2 | 9/2014 | Ayers et al. | |
| 8,878,264 B2 | 11/2014 | Velichko et al. | |
| 9,118,883 B2* | 8/2015 | Wan | H04N 5/765 |
| 2004/0155277 A1* | 8/2004 | Koh | H01L 27/0629 257/303 |
| 2007/0235827 A1* | 10/2007 | Altice | H01L 27/14609 257/428 |
| 2009/0021627 A1* | 1/2009 | Fossum | H01L 27/14609 348/308 |
| 2013/0027596 A1* | 1/2013 | Wan | H01L 27/14612 348/302 |
| 2013/0135486 A1* | 5/2013 | Wan | H04N 5/765 348/207.99 |
| 2014/0146209 A1* | 5/2014 | Wan | H01L 27/1461 348/296 |
| 2014/0197301 A1* | 7/2014 | Velichko | H01L 27/14625 250/208.1 |
| 2015/0124132 A1* | 5/2015 | Mabuchi | H01L 27/14609 348/296 |

* cited by examiner

IMAGE SENSORS HAVING HIGH-EFFICIENCY CHARGE STORAGE CAPABILITIES

CROSS-REFERENCE TO RELATED APPLICATION(S)

This application claims priority to U.S. Provisional Application No. 62/298,683, filed on Feb. 23, 2016, entitled "Image Sensors Having High Efficiency Charge Storage Capabilities," invented by Sergey Velichko, and is incorporated herein by reference and priority thereto for common subject matter is hereby claimed.

BACKGROUND

This relates generally to imaging devices, and more particularly, to imaging devices having image sensor pixels with charge storage capabilities.

Image sensors are commonly used in electronic devices such as cellular telephones, cameras, and computers to capture images. In a typical arrangement, an electronic device is provided with an array of image pixels arranged in pixel rows and pixel columns. Circuitry is commonly coupled to each pixel column for reading out image signals from the image pixels.

The image pixels contain a photodiode for generating charge in response to image light and a corresponding charge storage region. The photodiode and charge storage region are formed within a semiconductor substrate. Image sensors are often configured to operate using a global shutter or a rolling shutter scheme. When operating under a global shutter scheme, all of the pixels in the image sensor are reset simultaneously. A charge transfer operation is then used to simultaneously transfer the charge collected in the photodiode of each image pixel to the associated charge storage region. Data from each charge storage region is then read out on a per-row basis. When operating under a rolling shutter scheme, all of the pixels in a row in the image sensor are reset simultaneously. A charge transfer operation is used to transfer charge from the photodiodes to associated charge storage regions row-by-row. The charge storage regions are then read out row-by-row after some integration time between shutter and readout.

In conventional image sensor pixels, the charge storage region occupies a substantially similar sized area on the semiconductor substrate as the photodiode. However, occupying excessive area on the semiconductor substrate can undesirably expose the charge storage region to light that reduces the shutter efficiency of the image system. Additionally, excessively large charge storage regions reduce the size of the corresponding photodiode and thus the overall sensitivity of the pixel.

It would therefore be desirable to be able to provide imaging devices with improved image sensor pixels.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
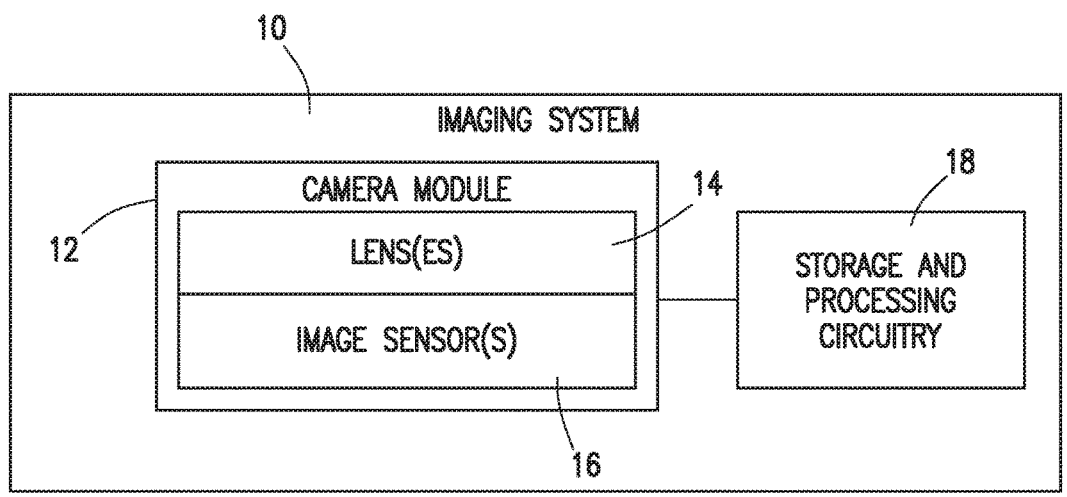
FIG. 1 is a diagram of an illustrative electronic device having an image sensor and processing circuitry for capturing images using an array of image pixels in accordance with an embodiment.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
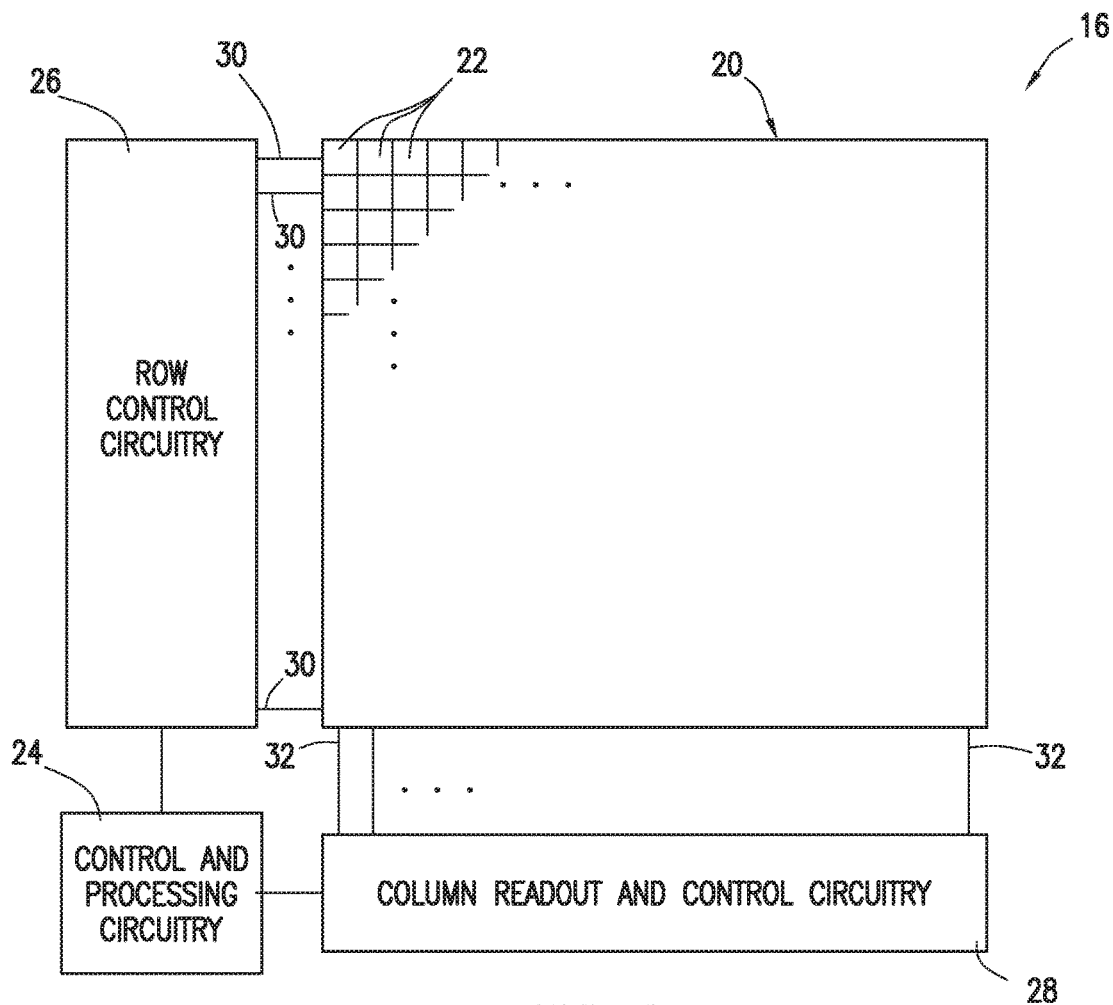
FIG. 2 is a diagram of an illustrative pixel array and associated readout circuitry for reading out image signals from the pixel array in accordance with an embodiment.

As shown in FIG. 2, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

If desired, image pixels 22 may include one or more photosensitive regions for generating charge in response to image light. Photosensitive regions within image pixels 22 may be arranged in rows and columns on array 20. Pixel array 20 may be provided with a color filter array having multiple color filter elements which allows a single image sensor to sample light of different colors. As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 22.

Image sensor 16 may be configured to support a global shutter operation (e.g., pixels 22 may be operated in a global shutter mode). For example, the image pixels 22 in array 20 may each include a photodiode, floating diffusion region, and local charge storage region. With a global shutter scheme, all of the pixels in the image sensor are reset simultaneously. A charge transfer operation is then used to simultaneously transfer the charge collected in the photodiode of each image pixel to the associated charge storage region. Data from each storage region may then be read out on a per-row basis, for example.

Figure 3:
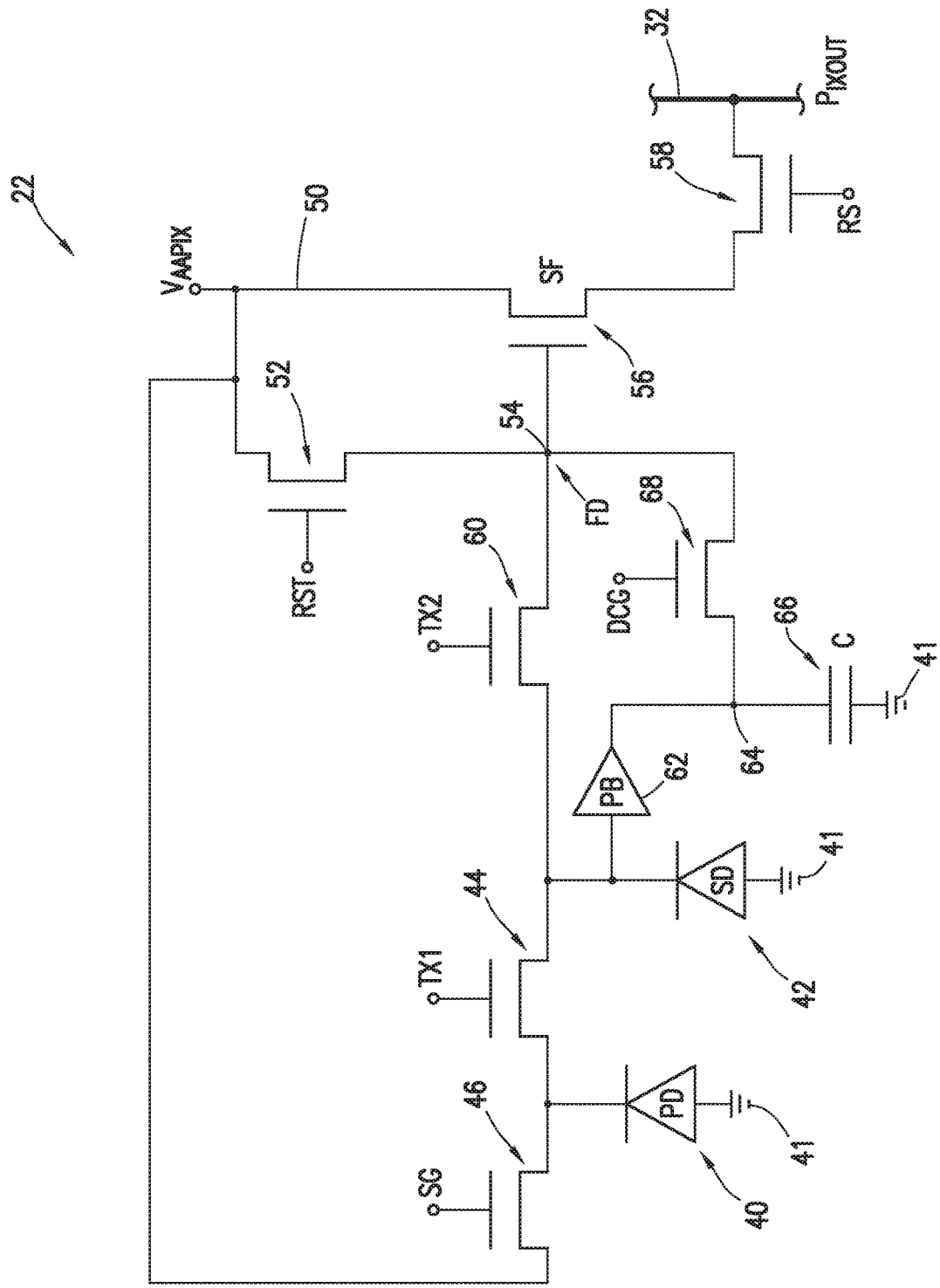
FIG. 3 is a circuit diagram of an illustrative image sensor pixel having a pinned potential barrier coupled between a charge storage node and a charge storage capacitor in accordance with an embodiment.

FIG. 3 is a circuit diagram of an illustrative image sensor pixel 22 operable in global shutter or rolling shutter mode. As shown in FIG. 3, pixel 22 may include a photosensitive element such as photodiode 40. A first (positive) power supply voltage $V_{AAPIX}$ may be supplied at positive power supply terminal 50. Power supply terminal 50 may be coupled to photodiode 40 through shutter gate 46. Incoming light may be collected by photodiode 40. Photodiode 40 may then generate charge (e.g., electrons) in response to receiving impinging photons. The amount of charge that is collected by photodiode 40 may depend on the intensity of the impinging light and the exposure duration (or integration time).

Before an image is acquired, reset control signal RST may be asserted. Asserting signal RST turns on reset transistor 52 and resets charge storage node 54 (also referred to as floating diffusion region FD) to $V_{AAPIX}$. Reset control signal RST may then be deasserted to turn off reset transistor 54. Similarly, prior to charge integration, a signal SG may be pulsed high to reset photodiode 40 to power supply voltage $V_{AAPIX}$ (e.g., by passing $V_{AAPIX}$ to photodiode 40 through shutter gate 46).

Pixel 22 may further include a first charge transfer transistor 44 operable to transfer charge from photodiode 40 to charge storage node 42 (sometimes called a charge storage region 42). Charge storage region 42 may be a pinned doped semiconductor region (e.g., a doped silicon region formed in a silicon substrate by ion implantation, impurity diffusion, or other doping techniques) that is capable of temporarily storing charge transferred from photodiode 40. Region 42 that is capable of temporarily storing transferred charge is sometimes referred to as a pinned "storage diode" (SD). Storage node 42 and photodiode 40 may be coupled to a ground power supply terminal 41. First charge transfer control signal TX1 may be pulsed high to transfer charge from photodiode 40 onto storage diode 42 through transistor 44. In the global shutter mode, signal TX1 may, for example, be pulsed high simultaneously for all pixels 22 in array 20.

Pixel 22 may include a second transfer gate (transistor) 60. Transfer gate 60 may have a gate terminal that is controlled by second charge transfer control signal TX2. Transfer control signal TX2 may be pulsed high to transfer charge from pinned storage diode region 42 onto floating diffusion region 54. Floating diffusion region 54 may be a doped semiconductor region (e.g., a region in a silicon substrate that is doped by ion implantation, impurity diffusion, or other doping processes), for example. Floating diffusion region 54 may serve as another storage region for storing charge during image data gathering operations.

Pixel 22 may also include readout circuitry that includes row-select transistor 58 and source-follower transistor 56. Transistor 58 may have a gate that is controlled by row select control signal RS. When control signal RS is asserted, transistor 58 is turned on and a corresponding signal PIX-OUT (e.g. an output signal having a magnitude that is proportional to the amount of charge at floating diffusion node 54) is passed onto column readout path 32.

Pixels 22 may be operated in a low conversion gain mode for capturing images of brighter scenery and in a high conversion gain mode for capturing images of darker scenery. During image capture operations, portions of array 20 may capture image signals from darker portions of an imaged scene whereas other portions of array 20 may capture image signals from brighter portions of the imaged scene. If desired, pixels 22 on array 20 may be provided with gain control signals by row control circuitry 26 and/or column readout circuitry 28 (FIG. 2).

Gain control signals received by pixels 22 may adjust the gain of the pixels. For example, pixels 22 located in brighter regions of array 20 may be provided with control signals via control lines 32 and/or 30 that instruct those pixels to operate in a low conversion gain mode (e.g., to prevent oversaturation of the image pixels), whereas pixels 22 located in darker regions of array 20 may be provided with control signals that instruct those pixels to operate in a high conversion gain mode (e.g., to improve signal-to-noise ratio in the image signals captured by those pixels). Gain control signals provided to pixels 22 may include, for example, dual conversion gain (DCG) control signals that are configured to adjust the charge storage capacity of a given pixel 22.

Pixels 22 may be provided with gain selection circuitry that enhances the dynamic range of the images produced by image sensor 16. For example, each pixel 22 may generate a corresponding signal using a selected conversion gain setting (conversion gain mode). In some configurations, a selected gain setting may depend on the amount of light captured by the pixel during an exposure (i.e., an integration period between resets of the pixel during which a photosensitive element generates charges in response to incoming light). In other configurations, the gain may be kept at a constant setting. As shown in FIG. 3, image pixel 22 may include DCG transistor 68 coupled in series between floating diffusion node 54 and circuit node 64. Capacitor 66 may be coupled between circuit node 64 and ground terminal 41. Capacitor 66 may have a charge storage capacity (capacitance) C. Capacitor 66 may include any desired number of capacitors having any desired capacitance in any desired arrangement. Capacitor 66 may, for example, be a metal-isolator-metal (MIM) capacitor, a polysilicon-isolator-polysilicon (PIP) capacitor, a deep trench capacitor, or any other desired type of capacitor.

Transistor 68 may have a gate terminal that is controlled using dual conversion gain control signal DCG. Pixel 22 may be operable in a high conversion gain mode (high gain mode) and in a low conversion gain mode (low gain mode). If transistor 68 is disabled (e.g., if signal DCG is low), pixel 22 is placed in the high conversion gain mode. If transistor 68 is enabled (e.g., if signal DCG is high), pixel 22 is placed in the low conversion gain mode.

In general, pixel conversion gain is inversely proportional to the amount of loading capacitance at node FD. When transistor 68 is turned on, capacitor 66 is switched into use in order to provide floating diffusion node 54 with additional capacitance (e.g., additional charge storage capacity). This results in a lower conversion gain for pixel 22. When transistor 68 is turned off, the additional loading of capacitor 66 is removed and pixel 22 reverts to a relatively higher pixel conversion gain configuration.

In general, the physical size (area) of storage node 42 is inversely proportional to the shutter efficiency of image sensor 16. For example, larger storage nodes 42 may cause sensor 16 to have reduced shutter efficiency than when smaller storage nodes 42 are used. Low shutter efficiency may result in ghosting or shadowing in the final image. In addition, larger storage nodes 42 may generate more undesirable dark current in the system than smaller storage nodes 42. Furthermore, larger storage nodes 42 may reduce the physical size of photodiode 40 more than when smaller storage nodes 42 are used, thus reducing the sensitivity and full-well capacity of photodiode 40. In order to mitigate ghosting and shadowing in the final image, to reduce the influence of dark currents in the system, and to provide space for a larger photodiode, it may be desirable to reduce the size of charge storage node 42. For example, storage node 42 may have a physical size that is at least five times smaller than photodiode 40. While reducing the physical size of storage node 42 may increase the shutter efficiency, reduce dark current in the system, and free more space for the photodiode, reducing the physical size of storage node 42 also reduces the charge storage capacity of node 42.

As shown in FIG. 3, charge storage node 42 may be coupled to capacitor 66 (e.g., via circuit node 64) to extend the charge storage capacity of node 42. If desired, DCG transistor 68 may be turned on to further extend the capacity of storage node 42 to include floating diffusion node 54. Coupling node 42 to capacitor 66 in this way may allow for an increase in global shutter efficiency, a decrease in dark current, and an increase in free more space available for the photodiode in pixel 22, without sacrificing charge storage capacity of storage node 42.

In order to further mitigate dark current in the system, a controlled potential barrier 62 may be interposed between storage region 42 and capacitor 66. Potential barrier 62 may, for example, allow pixel 22 to separate low readout noise on storage node 42 from relatively large signal stored on capacitor 66. Potential barrier 62 may provide a pinned potential that is between the pinned potential of photodiode 40 and the pinned potential of storage node 42. For example, potential barrier 62 may be above the pinned potential of photodiode 40 and below the pinned potential of storage node 42. As another example, potential barrier 62 may be below the pinned potential of photodiode 40 and above the pinned potential of storage node 42. The pinned potential of barrier 62 may be provided by the dopant concentration of barrier 62 in the semiconductor substrate of array 20. The example in which potential barrier 62 is provided as a doped region of array 20 is merely illustrative. If desired, potential barrier 62 may be replaced with a charge transfer transistor.

Figure 4:
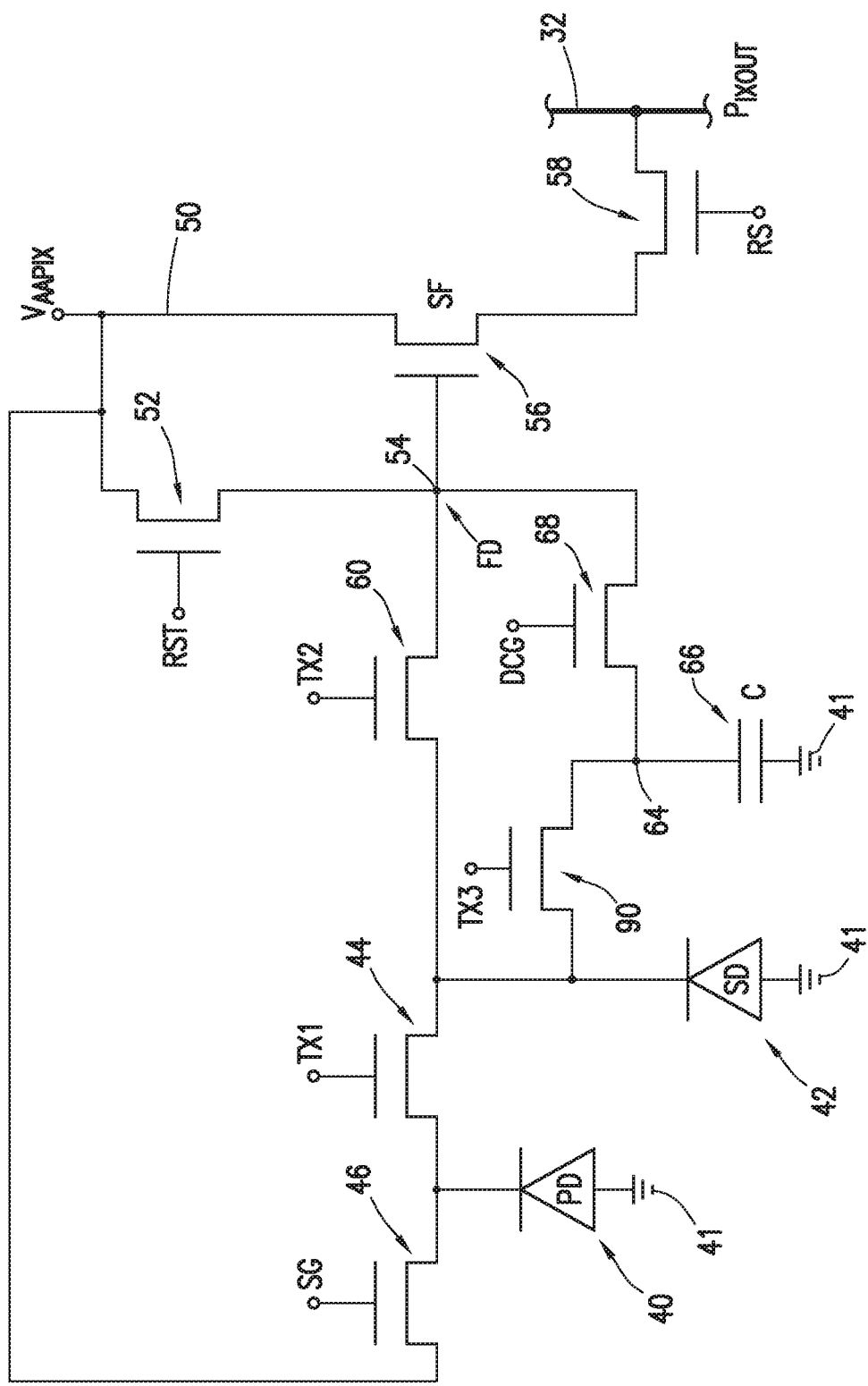
FIG. 4 is a circuit diagram of an illustrative image sensor pixel having a charge transfer transistor coupled between a charge storage node and a charge storage capacitor in accordance with an embodiment.

FIG. 4 is a circuit diagram of pixel 22 in which potential barrier 62 has been replaced by charge transfer transistor 90. The other components of pixel 22 shown in FIG. 4 function similarly to as described in connection with FIG. 3 and a corresponding description is not repeated for the sake of brevity.

As shown in FIG. 4, third charge transfer control signal TX3 may be adjusted to turn on transistor 90 so that charge on storage node 42 passes onto capacitor 66. Control signal TX3 may be controlled to adjust the amount of charge transfer from diode 42 to capacitor 41 (e.g., gate control signal TX3 may adjust a potential barrier provided between capacitor 66 and storage node 42 by transistor 90). The arrangement of FIG. 4 may, for example, allow for more flexible control of charge transfer onto capacitor 66 than in scenarios such as those in FIG. 3 in which pinned potential barrier 62 is used. However, the arrangement of FIG. 3 having pinned potential barrier 62 may exhibit reduced dark current, greater charge capacity, and a better tolerance to process variability relative to the arrangement of FIG. 4, for example.

Figure 5:
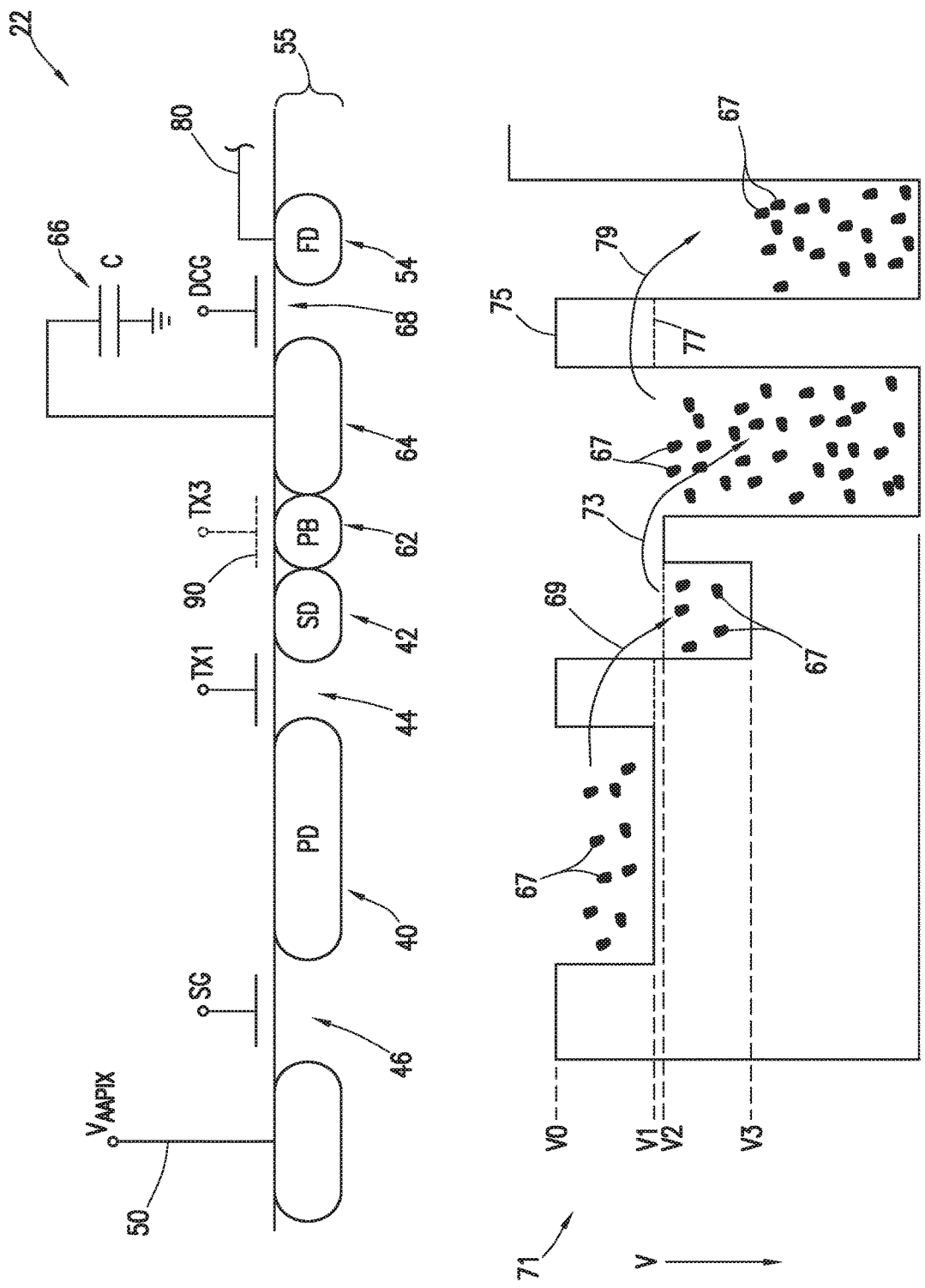
FIG. 5 is a cross-sectional diagram and potential diagram of an illustrative image pixel having a pinned potential barrier or transfer transistor coupled between a charge storage node and a charge storage capacitor in accordance with an embodiment.

FIG. 5 is a cross-sectional diagram of a global shutter pixel of the type shown in FIGS. 3 and 4. FIG. 5 also shows a corresponding potential diagram 71 that illustrates how charge flows in pixel 22 during imaging operations.

As shown in FIG. 5, pixel 22 includes a photodiode region 40, storage diode 42, potential barrier 62, node 64, and floating diffusion node 54 formed within semiconductor substrate 55. Regions 40 and 42 and potential barrier 62 may be formed from doped implants within semiconductor substrate 55. Regions 40, 42, and 62 may, for example, be formed from the same type of implants but at different dopant concentrations. The difference in dopant concentrations may establish the difference in potential between the regions.

As shown by potential diagram 71, photodiode 40 may be at pinned potential (voltage) level V1. Charge carriers (e.g., electrons) 67 may be accumulated in region 40 in response to image light. First charge transfer signal TX1 may be asserted to raise the potential of gate 44 from level V0 to level V1, allowing electrons 67 to flow onto storage diode 42 as shown by arrow 69. Storage diode 42 may be at pinned potential level V3 that is greater than level V1. Electrons 67 may accumulate in storage diode 42. Pinned potential barrier 62 may be at a potential level V2 that is less than level V3 and greater than level V1. When a sufficient amount of charge has accumulated on storage diode 42, the electrons may flow over potential barrier 62 onto capacitor 66 (e.g., via node 64) as shown by arrow 73. This may increase the effective charge capacity of storage diode 42 to include the capacity of capacitor 66 despite the relatively small physical area occupied by storage diode 42. Increasing the charge capacity of diode 42 may also increase the dynamic range of the pixel.

During readout, charge 67 may be transferred from nodes 42 and 66 onto floating diffusion 54 through transfer gate 60 (FIG. 3) and/or through gate 68 (e.g., by asserting signal DCG). For example, charge stored on node 42 at the end of signal integration may be passed to floating diffusion 54 for readout via transfer gate 60 whereas charge stored on capacitor 66 is transferred to floating diffusion 54 via DCG gate 68.

If desired, control signal DCG may optionally be adjusted to further extend the charge capacity of nodes 42 and 66 to include floating diffusion node 54. For example, the potential of DCG gate 68 may be raised from level 75 to level 77 by asserting control signal DCG, allowing electrons 67 to flow onto floating diffusion 54 as shown by arrow 79. This may further extend the charge capacity of storage region 42 despite the relatively small physical area occupied by storage region 42.

If desired, potential barrier 62 may be replaced by charge transfer gate 90. Charge transfer signal TX3 may be asserted to adjust the potential barrier between storage node 42 and node 64 (e.g., to adjust the potential barrier to level V2 or higher) to allow electrons 67 to flow onto capacitor 66.

Figure 6:
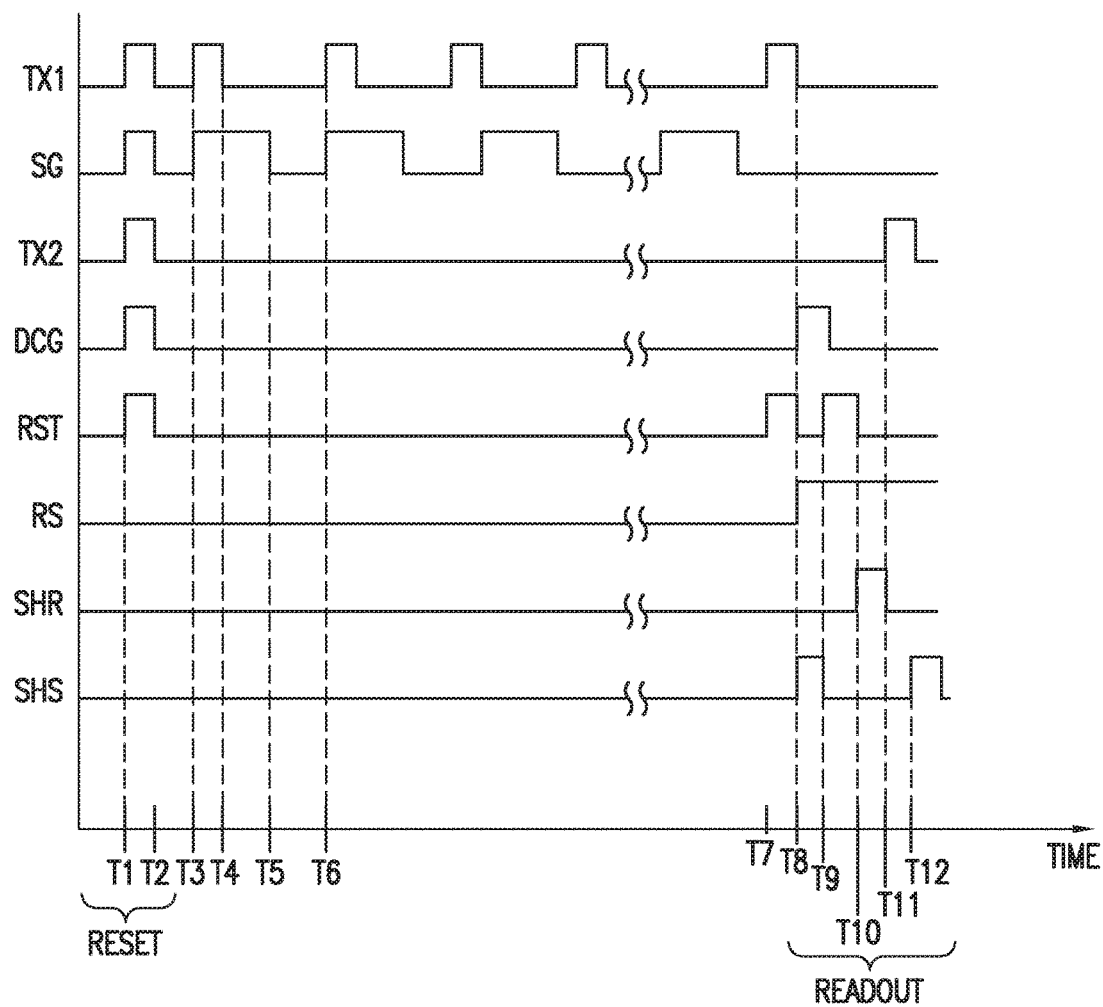
FIG. 6 is an illustrative timing diagram for operating an image sensor pixel of the type shown in FIGS. 3 and 5 In accordance with an embodiment.

FIG. 6 is an example of a timing diagram that may be used to control the operation of pixel 22. As shown in FIG. 6, charge transfer signals TX1 and TX2, shutter signal SG, conversion gain signal DCG, and reset signal RST may be asserted at time T1 and deasserted at time T2 in a reset phase. At time T3, transfer signal TX1 and shutter signal SG may be asserted (e.g., simultaneously for all pixels 22 in array 20 in the global shutter mode). Transfer signal TX1 may be deasserted at time T4 and shutter signal SG may be deasserted at time T5. Between time T5 and T6, photodiode 40 may integrate charge. At time T6, transfer signal TX1 is asserted for all pixels 22 in the array to transfer the integrated charge onto the corresponding storage node 42. Shutter signal SG may be asserted at or shortly after time T6 to reset photodiode 40. This process may be repeated any desired number of times (e.g., until time T7) to continue to accumulate charge onto storage diode 42.

By repeating this process, the charge integration may be spread across the total frame time of pixel 22. Such a timing spread may, for example, mitigate light source flickering (e.g., light-emitting diode (LED) flickering) to ensure that a flickering light source is captured by the pixel even if the light source happens to be off at a given time. If the charge transferred onto storage region 42 exceeds the pinned potential barrier 62, the excess charge may flow onto charge storage capacitor 66 (e.g., as shown by arrow 73 in FIG. 5). In scenarios where charge transfer transistor 90 is formed, transfer signal TX3 may be periodically pulsed or may be pulsed when excessive charge has been accumulated on storage node 42 to transfer the excess charge onto capacitor 66.

At time T7, reset signal RST may be asserted to reset floating diffusion 54. At time T8, reset signal RST may be deasserted. A readout phase may begin at time T8 to read out array 20 row by row. For example, at time T8, control signal DCG and row select signal RS may be asserted. This may allow the charge accumulated onto capacitor 66 prior to time T7 to be transferred onto floating diffusion 54. The charge from capacitor 66 is then read out onto line 32 as an image level signal via transistors 56 and 58. Image level sampling signal SHS may be asserted (e.g., provided to sample and hold circuitry in readout circuitry 28) at time T8 to sample the image level signal from capacitor 66. Signal SHS may be deasserted at time T9.

Reset signal RST may be asserted at time T9 and deasserted at time T10 to reset floating diffusion 54. A reset level sampling signal SHR may be asserted at time T9 (e.g., provided to sample and hold circuitry in readout circuitry 28) to sample a reset level from floating diffusion 54. At time T11, transfer signal TX2 may be pulsed high to transfer the integrated charge from charge storage node 42 onto floating diffusion 54. The charge from storage node 42 may be read out as an image level signal through transistors 56 and 58. Sample and hold signal SHS may be pulsed high at time T12 to sample the image signal from storage node 42. This image signal may be combined with the image signal transferred from capacitor 66 if desired (e.g., may be summed with the signal from capacitor 66, averaged with the signal from capacitor 66, or combined in any other desired manner). Readout circuitry 28 may use the sampled reset level signal to mitigate kTC reset noise (e.g., via a correlated double sampling (CDS) algorithm). The example of FIG. 6 is merely illustrative and, in general, any desired timing scheme may be used.

If desired, capacitor 66 may be used as a light shielding or light reflecting structure in array 20. For example, capacitor 66 may be used to shield storage node 42 from receiving image light, thereby increasing shutter efficiency of the pixel. For example, capacitor 66 may be used as a reflector of light into photodiode 40, thereby increasing sensitivity of the pixel.

Figure 7:
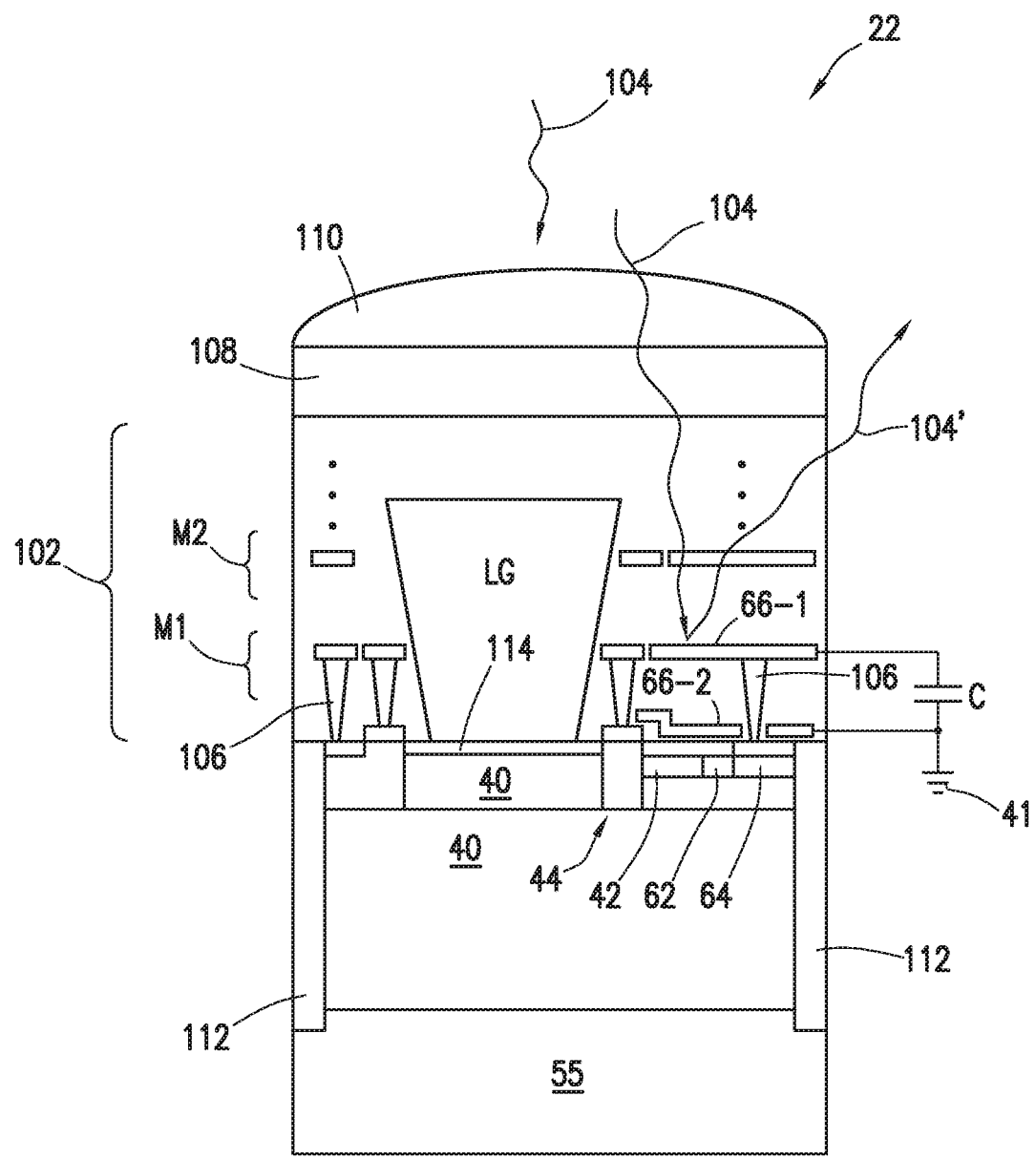
FIG. 7 is a cross-sectional diagram of an illustrative front-side illuminated image pixel of the type shown in FIGS. 3-5 in which the charge storage capacitor forms a light shield for the charge storage node in accordance with an embodiment.

A cross-sectional diagram showing how capacitor 66 may form a light shield structure within pixel 22 is shown in FIG. 7. In the example of FIG. 7, pixel 22 is a front-side-illuminated pixel. As shown in FIG. 7, pixel 22 may include photodiode 40 formed within a semiconductor substrate such as substrate 55 (e.g., a p-type semiconductor substrate, graded epi substrate, etc.). Pixel 22 may include storage diode 42, portions of transfer transistor 44, capacitor node 64, and pinned potential barrier 62 formed within substrate 55. Pinned potential barrier 62 may be replaced with transfer transistor 90 if desired. P-well isolation implants 112 may be formed on either side of photodiode 40 to isolate photodiode 40 from adjacent pixels 22.

A dielectric stack such as dielectric stack 102 may be formed on substrate 55. Dielectric stack 102 may be formed from dielectric material such as silicon oxide. A light guide structure LG may be formed in dielectric stack 102 above photodiode 40. Light guide LG may direct incoming image light 104 towards photodiode 40. Passivation pinning layer 114 may be interposed between light guide LG and photodiode 40 if desired. Interconnect routing structures 106 (e.g., conductive signal routing paths and conductive vias) may be formed in dielectric stack 102 to conductively couple one or more layers of stack 102. Dielectric stack 102 may therefore sometimes be referred to as an interconnect stack. In general, dielectric stack 102 may include alternating metal routing layers (e.g., dielectric layers in which metal routing paths are formed) and via layers (e.g., dielectric layers in which conductive vias coupling conductive structures from one adjacent metal routing layer to corresponding conductive structures in another adjacent metal routing layer). For example, stack 102 may include metal routing layers (sometimes referred to as metallization layers) M1 and M2. If desired, stack 102 may include any desired number of metallization layers.

A color filter array such as color filter array structure 108 may be formed on top of dielectric stack 102. Color filter element 108 may serve to pass light of a desired wavelength. A microlens array may be formed on top of color filter array 108. The microlens array may include a first microlens 110 formed on top of color filter element 108. Microlens 110 may be used to focus light 104 towards the light guide and eventually photodiode 40.

Capacitor 66 may be formed above substrate 55 and may serve as a light shield for storage node 42. Capacitor 66 may have a first capacitor plate 66-1 and a second capacitor plate 66-2. Second capacitor plate 66-2 may be coupled to ground terminal 41 whereas first capacitor plate 66-1 is coupled to node 64 (e.g., through a given conductive via 106). First and second capacitor plates 66-1 and 66-2 may be spaced apart to exhibit capacitance C.

Plates 66-1 and 66-2 may be formed in different layers of stack 102. For example, plate 66-1 may be formed in metallization layer M2 whereas plate 66-2 is formed in metallization layer M1. In general, plates 66-1 and 66-2 may be formed within any desired metallization layers. In another suitable arrangement, plate 66-1 is formed in metallization layer M1 is buried within a dielectric layer of stack 102 at a location above region 42. In yet another suitable arrangement, both plates 66-1 and 66-2 are buried. If desired, capacitor 66 may include more than two plates that are vertically stacked with respect to each other (e.g., three plates, four plates, five plates, more than five plates, etc.).

Embedded capacitor plates 66 may serve to reflect incoming light 104 as shown by arrow 104'. By reflecting the incoming light, plates 66 may effectively shield storage node 42 from the incoming light, thereby improving the shutter efficiency of pixel 22. As an example, forming capacitor plates 66 above region 42 may improve shutter efficiency by as much as two times at all wavelengths relative to scenarios where capacitor plates 66 are formed elsewhere.

In the example of FIG. 7, pixel 22 is a front side illuminated pixel in which image light 104 is received through metallization and signal routing layers 102. If desired, pixel 22 may be a back side illuminated pixel. In this scenario, capacitor plates 66 may serve as reflector structures that increase absorption of light 104 by photodiode 40.

Figure 8:
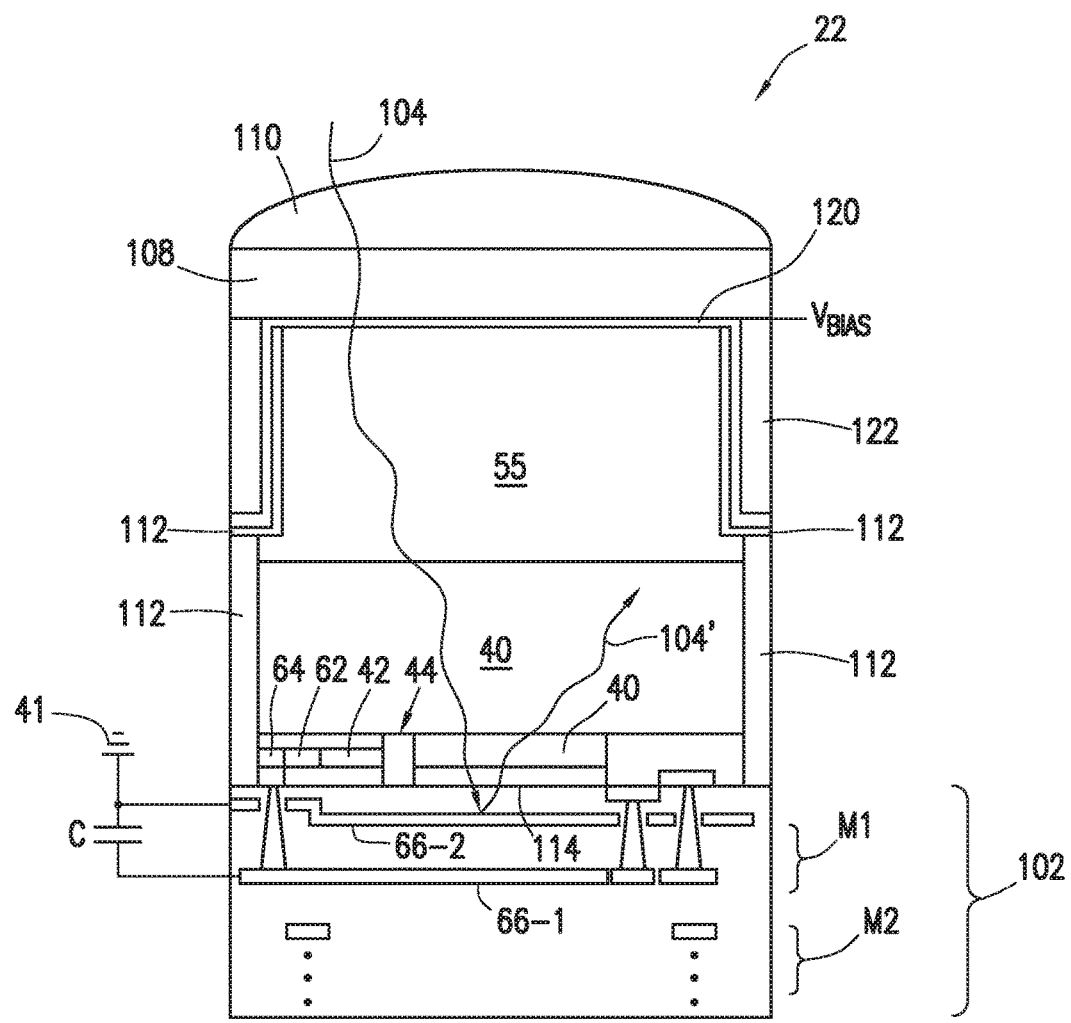
FIG. 8 is a cross-sectional diagram of an illustrative back-side illuminated image pixel of the type shown in FIGS. 3-5 in which the charge storage capacitor forms a light reflector for a photodiode in the pixel in accordance with an embodiment.

FIG. 8 is a cross-sectional diagram showing how capacitor 66 may form a light reflector structure for back side illuminated pixel 22. As shown in FIG. 8, pixel 22 may receive light 104 through the back side of the pixel (e.g., through substrate 55). Dielectric stack 102 may be formed on the front side of the pixel (e.g., the side of substrate 55 at which photodiode 40 is formed). If desired, deep trench isolation structures 122 may be formed on either side of substrate 55. Structures 122 may allow for an increase in silicon thickness and a boost of light absorption at photodiode 40 for all wavelengths. Optional conductive liner 120 may be interposed between color filter 108 and substrate 55 and between structures 122 and substrate 55. Liner 120 may be biased at voltage $V_{BIAS}$. Voltage $V_{BIAS}$ may be at a negative potential to help push photon generated charge towards photodiode 40 and reduce dark current generation. Voltage $V_{BIAS}$ may be held at a ground voltage level during readout. Liner 120 may, for example, include polysilicon or any other desired materials.

Capacitor plates 66-1 and 66-2 may extend behind nodes 42 and 40 (e.g., across the width of the pixel). Capacitor plates 66-1 and/or 66-2 may reflect image light 104 back towards photodiode 40 as shown by line 104'. This may increase the absorption of light 104 at all wavelengths within photodiode 40 relative to scenarios where no reflection is performed. For example, reflected light 104' may increase the absorption of photodiode 40 for green, red, and infrared (IR) light (whereas other wavelengths may be absorbed by photodiode 40 before reaching capacitor 66). The increase in absorption of light 104 may increase the quantum efficiency of pixel 22, for example.

Figure 9:
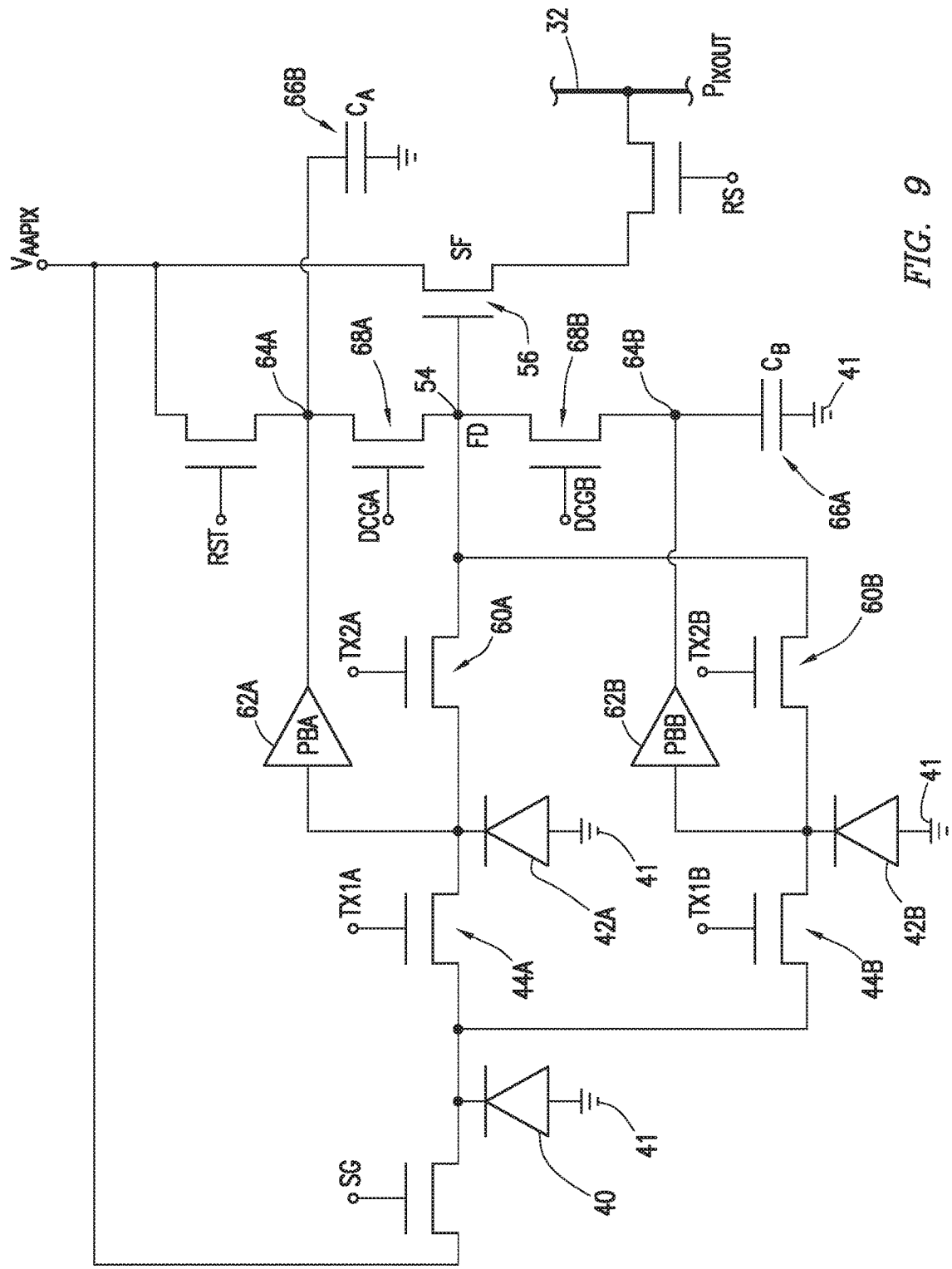
FIG. 9 is a circuit diagram of an illustrative image sensor pixel having pinned potential barriers coupled between multiple charge storage nodes and corresponding charge storage capacitors in accordance with an embodiment.

The examples of FIGS. 3 and 4 in which a single charge storage node 42 is used to store charge for photodiode 40 is merely illustrative. If desired, photodiode 40 and floating diffusion 54 in a given pixel may be coupled to multiple charge storage nodes 42. FIG. 9 is a circuit diagram showing a pixel 22 having multiple charge storage nodes 42.

As shown in FIG. 9, photodiode 410 may be coupled to a first charge storage node 42A through charge transfer transistor 44A and may be coupled to a second charge storage node 42B through charge transfer transistor 44B. Control signal TX1A may be pulsed to transfer charge from photodiode 40 onto storage node 42A. Control signal TX1B may be pulsed to transfer charge from photodiode 40 onto storage node 42B.

Storage node 42A may be coupled to floating diffusion 54 through transfer transistor 60A. Storage node 42B may be coupled to floating diffusion 54 through transfer transistor 60B. Control signal TX2A may be pulsed to transfer charge from storage node 42A onto floating diffusion 54. Control signal TX2B may be pulsed to transfer charge from storage node 42B onto floating diffusion 54.

Storage node 42A may be coupled to capacitor node 64A through pinned potential barrier (PBA) 62A. Storage node 42B may be coupled to capacitor node 64B through pinned potential barrier (PBB) 62B. Barrier 62A may be at a potential level that is between the pinned potential of photodiode 40 and the pinned potential of storage node 42A. Barrier 62B may be at a potential level that is between the pinned potential of photodiode 40 and the pinned potential of storage node 42B.

Capacitor 66A may be coupled to node 64A. Capacitor 66A may store excess charge from storage node 42A (e.g., when the accumulated charge exceeds pinned potential PBA). Capacitor 66B may be coupled to node 64B. Capacitor 66B may store excess charge from storage node 42B (e.g., when the accumulated charge exceeds pinned potential PBB).

Capacitor 66A may be coupled to floating diffusion 54 through DCGA transistor 68A. Capacitor 66B may be coupled to floating diffusion 54 through DCGB transistor 68B. Charge on capacitor 66A may be transferred to floating diffusion 54 by pulsing control signal DCGA provided to DCGA gate 68A. Charge on capacitor 66B may be transferred to floating diffusion 54 by pulsing control signal DCGB provided to DCGB gate 68B.

An arrangement having multiple storage nodes 42 such as the arrangement of FIG. 9 may allow for images to be acquired that are synchronized with different spectra light sources and/or projected patterns from a distance, for three dimensional imaging, for multi-color special imaging, etc. As an example, photodiode 40 may be exposed in synchronization with a light source or pattern and the acquired charge may be stored in storages 42A and 42B thereafter. Forming multiple storage nodes 42 may allow for light flicker mitigation (LFM) and/or high dynamic range (HDR) imaging operations to be performed, as examples.

If desired, potential barriers 62A and 62B may be replaced with corresponding transfer transistors such as transistor 90 of FIG. 4. In general, any desired number of storage regions 42 may be coupled to photodiode 40 and floating diffusion 54 (e.g., three regions 42, four regions 42, more than four regions 42, etc.).

Figure 10:
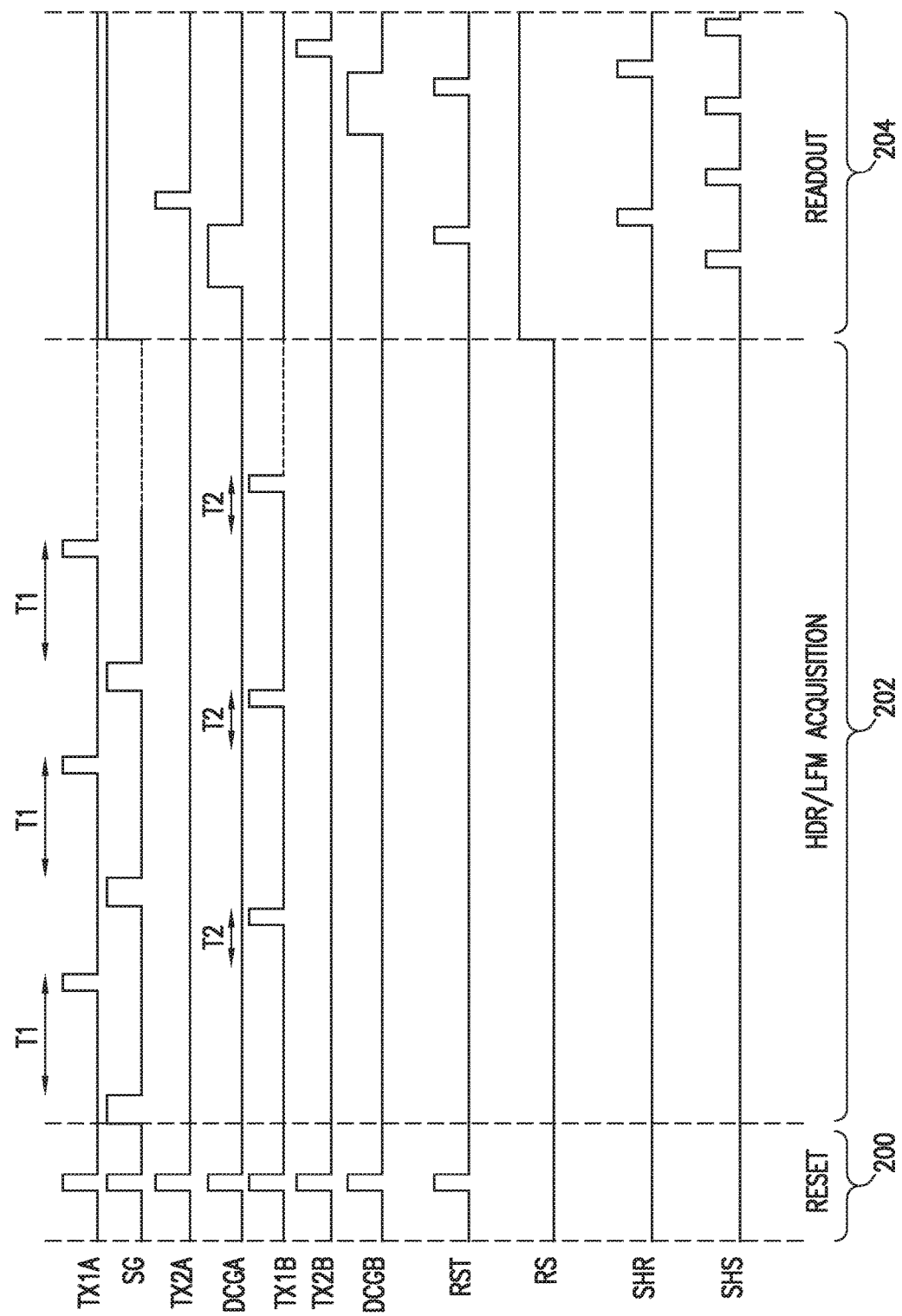
FIG. 10 is an illustrative timing diagram for operating an image sensor pixel of the type shown in FIG. 9 in accordance with an embodiment.

FIG. 10 is an example of a timing diagram that may be used for controlling a pixel of the type shown in FIG. 9. As shown in FIG. 10, control signals TX1A, SG, TX2A, DCGA, TX1B, TX2B, DCGB, and RST may be simultaneously asserted during reset phase 200. This may reset photodiode 40, storage nodes 42A and 42B, and capacitors 66A and 66B.

During acquisition phase 202, charge may be repeatedly accumulated onto storage nodes 42A and 42B by periodically pulsing transfer gates 44A and 44B, respectively. Periodically transferring charge to storage nodes 42A and 42B may, for example, mitigate light and LED flicker in the imaged scene. First storage node 42A may be used to store charge gathered during long integration times T1 whereas second storage node 42B is used to store charge gathered during short integration times T2 (e.g., long and short integration time image signals may be acquired). Capacitors 66A and 66B may store excess charge from storage nodes 42A and 42B, respectively, increasing the total dynamic range of the system despite the relatively small physical size of nodes 42A and 42B. The relatively small physical size of nodes 42A and 42B may allow for improved shutter efficiency relative to scenarios in which nodes 42A and 42B are approximately the same sizes as photodiode 40.

During readout phase 204, the charge stored on nodes 42A and 42B as well as the charge stored on capacitors 66A and 66B may be read out. The read out signals may form long and short integration signals. The long and short integration signals may be combined to form a final HDR image if desired. In the example of FIG. 10, control signal DCGA and sample and hold control signal SHS are simultaneously asserted to read out charge stored on capacitor 66A (e.g., a portion of the long integration image signal gathered by photodiode 40 and stored on capacitor 66A). Reset signal RST and reset sample and hold control signal SHR may subsequently be asserted to read out a reset level signal for performing correlated double sampling with the signal read out from capacitor 66A and later with the signal read out from storage diode 42A. Next, transfer signal TX2A and sample and hold control signal SHS may be asserted to read out a portion of the long integration image signal from storage diode 42A. This portion of the readout signal may be combined with the signal read out from capacitor 66A if desired.

Next, control signal DCGB and sample and hold control signal SHS may be simultaneously asserted to read out charge stored on capacitor 66B (e.g., a portion of the short integration image signal gathered by photodiode 40 and stored on capacitor 66B). Reset signal RST and reset sample and hold control signal SHR may subsequently be asserted to read out a reset level signal for performing correlated double sampling with the signal read out from capacitor 66B and later with the signal read out from storage diode 42B. Next, transfer signal TX2B and sample and hold control signal SHS may be asserted to read out a portion of the short integration image signal from storage diode 42B. This portion of the readout signal may be combined with the signal read out from capacitor 66B if desired.

The image signals read out from capacitor 66A and storage node 42A may be combined with the image signals read out from capacitor 66B and storage node 42B to generate a high dynamic range image (e.g., an image in which long integration time image signals from node 42A and capacitor 66A are used for relatively dim portions of the imaged scene and in which short integration time image signals from node 42B and capacitor 66B are used for relatively bright portions of the imaged scene or signals from node 42A and node 42B are summed and signals from capacitor 62A and capacitor 62B are summed and results of both operations are combined into one HDR signal). The example of FIG. 10 is merely illustrative. In general, any desired timing scheme may be used for operating pixels 22 having multiple storage nodes 42.

Figure 11:
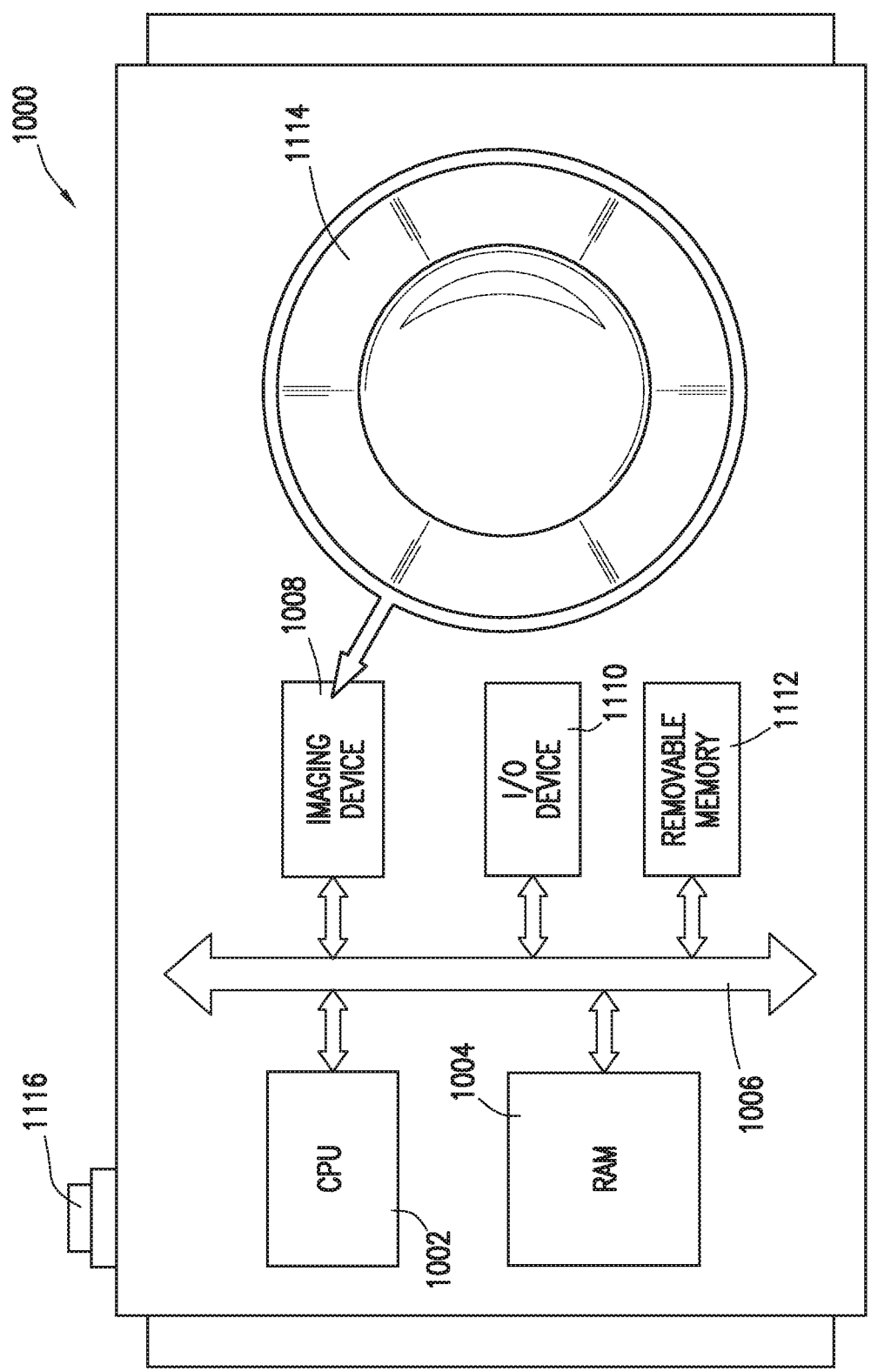
FIG. 11 is a block diagram of a processor system employing the embodiments of FIGS. 1-10 in accordance with an embodiment of the present invention.

FIG. 11 is a simplified diagram of an illustrative processor system 1000, such as a digital camera, which includes an imaging device 1008 (e.g., the camera module of FIG. 1) employing an imager having pixels as described above in connection with FIGS. 1-10. Without being limiting, such a system could include a computer system, still or video camera system, scanner, machine vision system, vehicle navigation system, video phone, surveillance system, auto focus system, star tracker system, motion detection system, image stabilization system, and other systems employing an imaging device.

Processor system 1000, for example a digital still or video camera system, generally includes a lens 1114 for focusing an image onto one or more pixel array in imaging device 1008 when a shutter release button 1116 is pressed and a central processing unit (CPU) 1002 such as a microprocessor which controls camera and one or more image flow functions. Processing unit 1102 can communicate with one or more input-output (I/O) devices 1110 over a system bus 1006. Imaging device 1008 may also communicate with CPU 1002 over bus 1006. System 1000 may also include random access memory (RAM) 1004 and can optionally include removable memory 1112, such as flash memory, which can also communicate with CPU 1002 over the bus 1006. Imaging device 1008 may be combined with the CPU, with or without memory storage on a single integrated circuit or on a different chip. Although bus 1006 is illustrated as a single bus, it may be one or more busses, bridges or other communication paths used to interconnect system components of system 1000.

Various embodiments have been described illustrating systems and methods for generating images using image sensor pixels having charge storage nodes that are substantially smaller than the corresponding photodiodes in the pixels.

The image sensor pixel may include a photodiode, a charge storage node, a floating diffusion node, and a capacitor. A first transistor may be coupled between the photodiode and the charge storage node. A second transistor may be coupled between the charge storage node and the floating diffusion node. A third transistor may be coupled between the capacitor and the floating diffusion node. A pinned potential barrier may be formed between the charge storage node and the capacitor. The pinned potential barrier may exhibit a potential that is between the potential of the photodiode and the potential of the charge storage node. As an example, the pinned potential barrier, the photodiode, and the charge storage node may be formed using semiconductor implants of the same type but using different dopant concentrations.

In another suitable arrangement, a fourth transistor may be coupled between the charge storage node and the capacitor. A gate terminal of the fourth transistor may receive a control signal that adjusts a potential barrier between the charge storage node and the capacitor to a level that is between the potential of the photodiode and the potential of the charge storage node.

As an example, the photodiode may be configured to generate image charge in response to image light. The first transistor may transfer the image charge onto the charge storage node. The fourth transistor or the pinned potential barrier may transfer a portion (e.g., an overflow portion) of the image charge from the charge storage node to the capacitor. The third transistor may be configured transfer the portion of the image charge from the capacitor to the floating diffusion node. If desired, the third transistor may be controlled to adjust a conversion gain of the pixel.

Readout circuitry in the image sensor pixel may output the portion of the image charge from the floating diffusion circuitry onto a column read out line. The second transistor may be configured to transfer a remaining portion of the image charge from the charge storage node to the floating diffusion node after the portion of the image charge has been output to the column readout line. The readout circuitry may be configured to output the remaining portion of the image charge from the floating diffusion node. The read out charges may be combined to generate a final image signal.

In accordance with any of the above arrangements, the capacitor may form a light shield structure that shields the charge storage node from the image light. In accordance with any of the above arrangements, the capacitor may form a light reflector structure that reflects at least some of the image light towards the photodiode.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor pixel, comprising:
    a photosensitive region that generates charge in response to image light, wherein the photosensitive region comprises semiconductor implants of a first type and having a first dopant concentration;
    a charge storage region;
    a charge transfer transistor that is configured to transfer the generated charge from the photosensitive region to the charge storage region, wherein the charge storage region comprises semiconductor implants of the first type and having a second dopant concentration that is different from the first dopant concentration;
    a capacitor; and
    a pinned potential barrier coupled between the charge storage region and the capacitor, wherein the pinned potential barrier is configured to convey a portion of the transferred charge from the charge storage region to the capacitor, and the pinned potential barrier comprises semiconductor implants of the first type and having a third dopant concentration that is different from the first and second dopant concentrations.

2. The image sensor pixel defined in claim 1, wherein the photosensitive region exhibits a first pinned potential, the charge storage region exhibits a second pinned potential, and the pinned potential barrier exhibits a third pinned potential that is between the first pinned potential and the second pinned potential.

3. The image sensor pixel defined in claim 1, further comprising:
    a floating diffusion region; and
    an additional charge transfer transistor configured to transfer at least some of the transferred charge from the charge storage region to the floating diffusion region.

4. The image sensor pixel defined in claim 3, further comprising:
    a dual conversion gain transistor coupled between the capacitor and the floating diffusion region, wherein the dual conversion gain transistor is configured to transfer the portion of the transferred charge from the capacitor to the floating diffusion region.

5. The image sensor pixel defined in claim 1, further comprising:
    a floating diffusion region; and
    a transistor coupled between the capacitor and the floating diffusion region, wherein the transistor is configured to transfer the portion of the transferred charge from the capacitor to the floating diffusion region.

6. The image sensor pixel defined by claim 5, wherein the transistor is configured to adjust a conversion gain of the image sensor pixel.

7. The image sensor pixel defined in claim 5, further comprising:
    an additional charge transfer transistor coupled between the charge storage region and the floating diffusion region.

8. The image sensor pixel defined in claim 1, wherein the charge storage region and the photosensitive region are formed within a semiconductor substrate, wherein the capacitor is formed on the semiconductor substrate and over the charge storage region, and wherein the capacitor is configured to shield the charge storage region from the image light.

9. The image sensor pixel defined in claim 8, further comprising:
a dielectric stack formed above the semiconductor substrate, wherein the capacitor comprises first and second capacitor plates, wherein the first capacitor plate is formed in a first metallization layer of the dielectric stack, and wherein the second capacitor plate is formed in a second metallization layer of the dielectric stack.

10. The image sensor pixel defined in claim 1, wherein the charge storage region and the photosensitive region are formed within a semiconductor substrate, wherein the capacitor extends behind the photosensitive region and below the semiconductor substrate, and wherein the capacitor is configured to reflect at least some of the image light towards the photosensitive region.

11. The image sensor pixel defined in claim 10, further comprising:
a conductive layer formed over a side of the semiconductor substrate that opposes the photosensitive region, wherein the conductive layer is biased using a negative bias voltage.

12. The image sensor pixel defined in claim 1, further comprising:
an additional charge storage region;
an additional charge transfer transistor coupled between the additional charge storage region and the photosensitive region;
an additional capacitor; and
an additional pinned potential barrier coupled between the additional capacitor and the additional charge storage region.

13. The image sensor pixel defined in claim 1, wherein the capacitor comprises capacitor structures selected from the group of capacitor structures consisting of:
metal-isolator-metal (MIM) capacitor structures, polysilicon-isolator-polysilicon (PIP) capacitor structures, and deep trench capacitor structures.

14. The image sensor pixel defined in claim 1, further comprising:
deep trench isolation structures formed on opposing sides of the photosensitive region.

15. Image sensor pixel circuitry, comprising:
a photodiode, wherein the photosensitive region exhibits a first pinned potential;
a charge storage node, wherein the charge storage region exhibits a second pinned potential that provides the charge storage node with a charge storage capacity;
a floating diffusion node;
a capacitor;
a first transistor coupled between the photodiode and the charge storage node;
a second transistor coupled between the charge storage node and the floating diffusion node;
a third transistor coupled between the capacitor and the floating diffusion node; and
a fourth transistor coupled between the charge storage node and the capacitor, wherein a gate terminal of the fourth transistor receives a control signal that adjusts a potential barrier between the charge storage node and the capacitor to transfer charge from the charge storage node onto the capacitor, wherein the potential barrier exhibits a third pinned potential that is between the first pinned potential and the second pinned potential, and wherein only charge that exceeds the charge storage capacity of the charge storage node flows over the potential barrier to the capacitor.

16. The image sensor pixel circuitry defined in claim 15, wherein the third transistor is configured to convey at least some of the transferred charge from the capacitor to the floating diffusion node.

17. The image sensor pixel circuitry defined in claim 16, wherein the photodiode is configured to generate an image charge in response to image light, the first transistor is configured to transfer the image charge onto the charge storage node, the fourth transistor is configured to transfer a portion of the image charge from the charge storage node to the capacitor, and the third transistor is configured to transfer the portion of the image charge from the capacitor to the floating diffusion node, the image sensor pixel circuitry further comprising:
readout circuitry, wherein the readout circuitry is configured to output the portion of the image charge from the floating diffusion circuitry to a column read out line, wherein the second transistor is configured to transfer a remaining portion of the image charge from the charge storage node to the floating diffusion node after the portion of the image charge has been output to the column readout line, and wherein the readout circuitry is configured to output the remaining portion of the image charge from the floating diffusion node.

18. The image sensor pixel defined in claim 17, wherein the capacitor comprises capacitor structures selected from the group of capacitor structures consisting of: light shielding capacitor structures configured to shield the charge storage node from the image light and light reflecting capacitor structures configured to reflect at least some of the image light towards the photodiode.

19. A system, comprising:
a central processing unit;
memory;
a lens;
input-output circuitry; and
a global shutter image pixel, wherein the global shutter image pixel comprises:
a substrate;
a photodiode in the substrate, wherein the photodiode exhibits a first pinned potential, and wherein the lens is configured to direct image light towards the photodiode;
a charge storage diode in the substrate, wherein the charge storage diode exhibits a second pinned potential;
a floating diffusion node in the substrate;
a capacitor formed over the substrate;
a dual conversion gain transistor coupled between the capacitor and the floating diffusion node; and
a pinned potential barrier in the substrate and coupled between the charge storage diode and the capacitor, wherein the pinned potential barrier exhibits a third pinned potential that is between the first pinned potential and the second pinned potential, and wherein the capacitor comprises capacitor structures selected from the group of capacitor structures consisting of:
light shielding capacitor structures configured to shield the charge storage diode from the image light, and light reflecting capacitor structures configured to reflect at least some of the image light towards the photodiode.

* * * * *